(12) United States Patent
Sinha et al.

(10) Patent No.: US 11,177,015 B2
(45) Date of Patent: Nov. 16, 2021

(54) BUILT-IN SELF-TESTING AND FAILURE CORRECTION CIRCUITRY

(71) Applicant: NXP USA, Inc., Austin, TX (US)

(72) Inventors: Nidhi Sinha, Noida (IN); Garima Sharda, Noida (IN); Dinesh Joshi, Delhi (IN); Akshay Pathak, Noida (IN)

(73) Assignee: NXP USA, INC., Austin, TX (US)

( * ) Notice: Subject to any disclaimer, the term of this patent is extended or adjusted under 35 U.S.C. 154(b) by 193 days.

(21) Appl. No.: 16/705,038

(22) Filed: Dec. 5, 2019

(65) Prior Publication Data

US 2021/0174888 A1   Jun. 10, 2021

(51) Int. Cl.
 *G11C 29/38*   (2006.01)
 *G11C 29/44*   (2006.01)
 *H03K 5/1534*   (2006.01)

(52) U.S. Cl.
 CPC .............. *G11C 29/38* (2013.01); *G11C 29/44* (2013.01); *H03K 5/1534* (2013.01)

(58) Field of Classification Search
 None
 See application file for complete search history.

(56) References Cited

U.S. PATENT DOCUMENTS

| 4,943,779 | A | 7/1990 | Pedersen et al. |
| 5,023,571 | A | 6/1991 | Fullmer et al. |
| 5,802,073 | A | 9/1998 | Platt |
| 5,867,644 | A | 2/1999 | Ranson et al. |
| 6,006,311 | A | 12/1999 | Arimilli et al. |
| 2014/0325463 | A1 | 10/2014 | Bahadra et al. |
| 2015/0137841 | A1* | 5/2015 | Thanner ........... G01R 31/31701 324/750.3 |

FOREIGN PATENT DOCUMENTS

CN   103983912 A   *   8/2014

OTHER PUBLICATIONS

Kavousianos et al., "Testing for SoCs with advanced static and dynamic power-management capabilities", IEEE, 2013 (Year: 2013).*

* cited by examiner

*Primary Examiner* — Cynthia Britt
*Assistant Examiner* — Matthew W Wahlin

(57) ABSTRACT

A system-on-chip (SoC) includes a processor, a built-in self-testing (BIST) circuitry, and an adaptive masking circuitry. The processor generates a sweep enable (SWEN) signal to initiate a self-testing operation of the SoC. The BIST circuitry receives the SWEN signal and generates a set of sweep events, such that a transition of the processor from a low power (LP) mode to an active mode is initiated based on the generation of each sweep event. The BIST circuitry further receives a status signal, and identifies a subset of sweep events at which the transition of the processor from the LP mode to the active mode failed, for generating sweep failure data. The adaptive masking circuitry receives the sweep failure data and generates a mask signal, to prevent a transition of the first processor from the LP mode to the active mode, during a non-testing operation of the SoC.

20 Claims, 7 Drawing Sheets

BUILT-IN SELF-TESTING AND FAILURE CORRECTION CIRCUITRY

BACKGROUND

The present invention relates generally to electronic circuits, and, more particularly, to a built-in self-testing and failure correction circuitry.

An integrated circuit (IC) typically transitions from a low power mode to an active mode (i.e., power-up mode) asynchronously (i.e., based on an asynchronous trigger signal). However, an asynchronous trigger signal may lead to a glitch during the transition of the IC. To detect the glitch, pre-silicon verification (that includes register-transfer-level (RTL) verification and analog-mixed signal (AMS) verification) and post-silicon verification (that includes volume testing) of the IC is performed. In the RTL verification, a register level design of the IC is verified as compared to a transistor level design of the IC, whereas in AMS verification, a small subset of critical functional signals of the IC are verified. Further, the volume testing of the IC is performed to capture manufacturing defects in the IC. However, the RTL verification and the volume testing may not capture the glitch occurred due to the asynchronous trigger signal. Further, the critical functional signals that are verified during the AMS verification may exclude the asynchronous trigger signal. In addition, current ICs do not include dedicated built-in self-testing circuitries for capturing the glitch due to the asynchronous trigger signal, and as the current mechanisms may fail to capture such glitch, the undetected glitch may cause the IC to malfunction. Thus, a technical solution is required to solve the aforementioned problems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
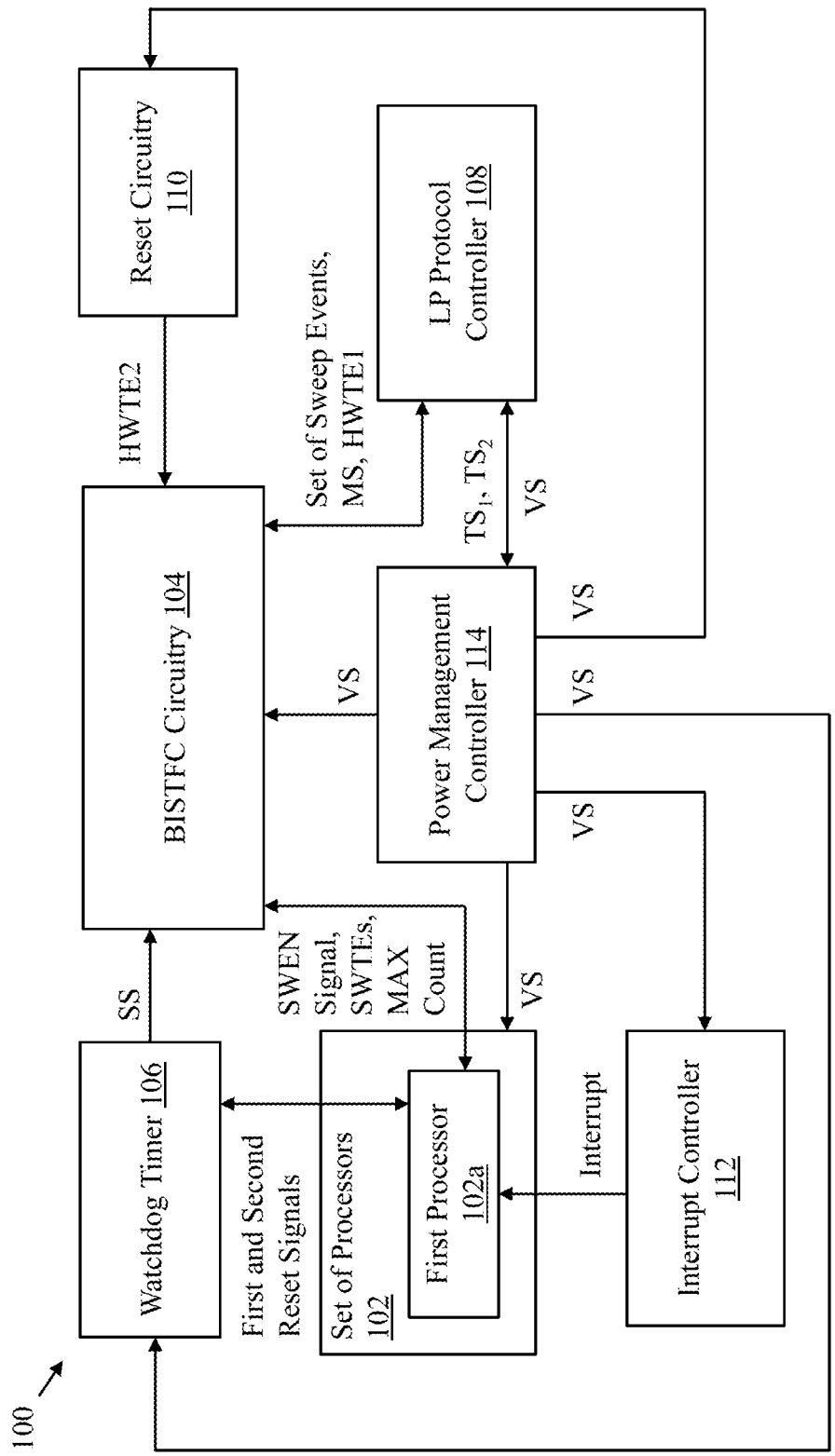
FIG. 1 is a schematic block diagram of a system-on-chip (SoC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, a system-on-chip (SoC) is provided. The SoC includes a first processor and a built-in self-testing (BIST) circuitry. The first processor generates a sweep enable (SWEN) signal to initiate a self-testing operation of the SoC. The BIST circuitry includes a sweep control circuitry and a diagnostic support circuitry. The sweep control circuitry is connected to the first processor for receiving the SWEN signal and generates a set of sweep events, such that a transition of the first processor from a low power (LP) mode to an active mode during the self-testing operation is initiated based on the generation of each sweep event of the set of sweep events. The diagnostic support circuitry is connected to the sweep control circuitry for receiving the set of sweep events, further receives a status signal, identifies, based on the status signal, a subset of sweep events from the set of sweep events at which the transition of the first processor from the LP mode to the active mode failed, and generates sweep failure data. The status signal indicates whether the first processor is reset.

In another embodiment, an SoC is provided. The SoC includes a first processor and a built-in self-testing and failure correction (BISTFC) circuitry. The first processor generates a SWEN signal to initiate a self-testing operation of the SoC. The BISTFC circuitry includes a BIST circuitry and an adaptive masking circuitry. The BIST circuitry includes a sweep control circuitry and a diagnostic support circuitry. The sweep control circuitry is connected to the first processor for receiving the SWEN signal and generates a set of sweep events. A transition of the first processor from an LP mode to an active mode during the self-testing operation is initiated based on the generation of each sweep event of the set of sweep events. The diagnostic support circuitry is connected to the sweep control circuitry for receiving the set of sweep events. The sweep control circuitry further receives a status signal, identifies, based on the status signal, a subset of sweep events from the set of sweep events at which the transition of the first processor from the LP mode to the active mode failed, and generates sweep failure data. The status signal indicates whether the first processor is reset. The adaptive masking circuitry is connected to the diagnostic support circuitry for receiving the sweep failure data and generating a mask signal based on the sweep failure data. The mask signal prevents a transition of the first processor from the LP mode to the active mode, during a non-testing operation of the SoC.

In yet another embodiment, a method for testing an SoC is provided. The method includes generating, based on a SWEN signal that indicates an initiation of a self-testing operation of the SoC, by a BIST circuitry of the SoC, a set of sweep events. A transition of a first processor of the SoC from an LP mode to an active mode during the self-testing operation is initiated based on the generation of each sweep event of the set of sweep events. The method further includes identifying, by the BIST circuitry, based on a status signal, a subset of sweep events from the set of sweep events at which the transition of the first processor from the LP mode to the active mode failed, to generate sweep failure data. The status signal indicates whether the first processor is reset. Further, the generation of the sweep failure data is indicative of a completion of the self-testing operation.

Various embodiments of the present invention provide an SOC that includes a BIST circuitry and an adaptive masking circuitry. The BIST circuitry includes a sweep control circuitry and a diagnostic support circuitry. The sweep control circuitry receives a SWEN signal and generates a set of sweep events. A transition of a first processor of the SoC from an LP mode to an active mode during a self-testing operation of the SoC is initiated based on the generation of each sweep event of the set of sweep events. The diagnostic support circuitry identifies, to generate sweep failure data, a subset of sweep events from the set of sweep events at which the transition of the first processor from the LP mode to the active mode failed (due to a glitch in the SoC). The adaptive masking circuitry receives the sweep failure data and generates a mask signal to prevent an asynchronous transition of the first processor from the LP mode to the active mode, during a non-testing operation of the SoC.

The BISTFC circuitry identifies the subset of sweep events to generate the sweep failure data and generates the mask signal based on the sweep failure data during the non-testing operation. Thus, based on the mask signal, the BISTFC circuitry (which is included in the SoC) prevents a failure in the transition of the first processor by detecting and correcting the glitch that may occur due to the triggering of the asynchronous transition of the first processor 102a by an asynchronous trigger signal.

Referring now to FIG. 1, a schematic block diagram of a system-on-chip (SoC) 100 in accordance with an embodiment of the present invention is shown. In one embodiment, the SoC 100 is utilized in an automotive application, i.e., a gateway module that is used for communication within a vehicle network system, a power window controller for controlling power windows of a vehicle, a keyless entry system of a vehicle, and the like. The SoC 100 includes a set of processors 102 of which a first processor 102a is shown, a built-in self-testing and failure correction (BISTFC) circuitry 104, a watchdog timer 106, a low power (LP) protocol controller 108, a reset circuitry 110, an interrupt controller 112, and a power management controller 114. It will be understood by a person skilled in the art that utilization of the SoC 100 is not limited to the automotive application. The SoC 100 may be utilized in other applications that include analog devices and require power management control, such as electronic point-of-sale (POS) devices, security cameras, daylight harvesters, and the like.

The first processor 102a executes a set of operations for facilitating an application (such as the automotive application). The first processor 102a operates in one of an active mode and an LP mode at a time. In the active mode, all internal circuit blocks (not shown) of the first processor 102a are powered-up (i.e., all internal circuit blocks receive a power supply signal VS). In the LP mode, a few of the internal circuit blocks that remain idle during the active mode for a threshold time duration are powered down (i.e., such internal circuit blocks receive no or less power as compared to other internal circuit blocks, whereas the other internal circuit blocks receive the same power as received by all the internal circuit blocks in the active mode). The first processor 102a thus executes a subset of the set of operations in the LP mode. The transition of the first processor 102a to the active mode from the LP mode is asynchronous (i.e., the power supply signal VS is received by the first processor 102a asynchronously and thus acts as an asynchronous trigger signal). Due to the asynchronous trigger signal, a glitch may occur that may lead to failure of the transition of the first processor 102a.

For detecting the glitch, the first processor 102a periodically generates a sweep enable (SWEN) signal to initiate a self-testing operation of the SoC 100. In one embodiment, when the SWEN signal is high, the self-testing operation of the SoC 100 occurs for detecting the glitch, and when the SWEN signal is low, a non-testing operation of the SoC 100 occurs.

Although an operation of the SoC 100 is described with respect to the first processor 102a, the present invention is not limited to it. It will be understood by a person skilled in the art that an operation of the SoC 100 with respect to other processors (not shown) of the set of processors 102 is similar to the operation of the SoC 100 with respect to the first processor 102a.

The BISTFC circuitry 104 detects and corrects the glitch (i.e., prevents the failure of the transition of the first processor 102a from the LP mode to the active mode). The BISTFC circuitry 104 is connected to the first processor 102a for receiving the SWEN signal, multiple software trigger events (SWTEs), and a maximum (MAX) count. Further, the BISTFC circuitry 104 receives first through third hardware trigger events (HWTEs). The first through third HWTEs are hereinafter referred to as HWTE1, HWTE2, and HWTE3, respectively.

For detecting the glitch, the HWTE1-HWTE3 and the SWTEs are generated during the self-testing operation such that a time duration of each HWTE and SWTE is equal to a MAX duration for the first processor 102a to remain in the LP mode before transitioning to the active mode during the self-testing operation. The BISTFC circuitry 104 further receives a status signal SS. The status signal SS indicates whether the first processor 102a is reset. In one embodiment, the first processor 102a generates the SWTEs and the MAX count, and configures the MAX duration. In another embodiment, a programmable device (not shown) of the BISTFC circuitry 104 generates the SWTEs and the MAX count, and configures the MAX duration.

Figure 2:
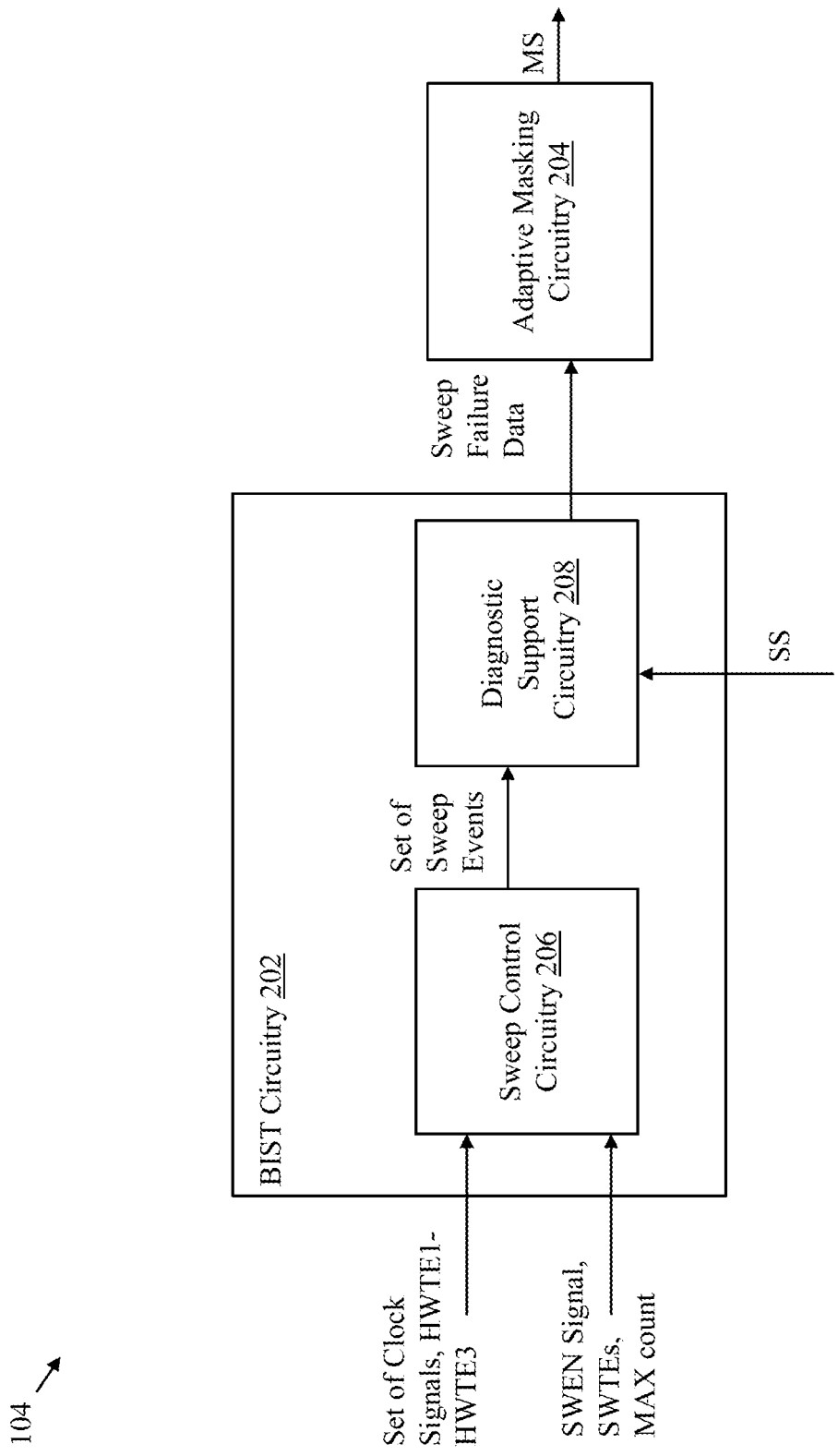
FIG. 2 is a schematic block diagram of a built-in self-testing and failure correction (BISTFC) circuitry of the SoC of FIG. 1 in accordance with an embodiment of the present invention.
Figure 3:
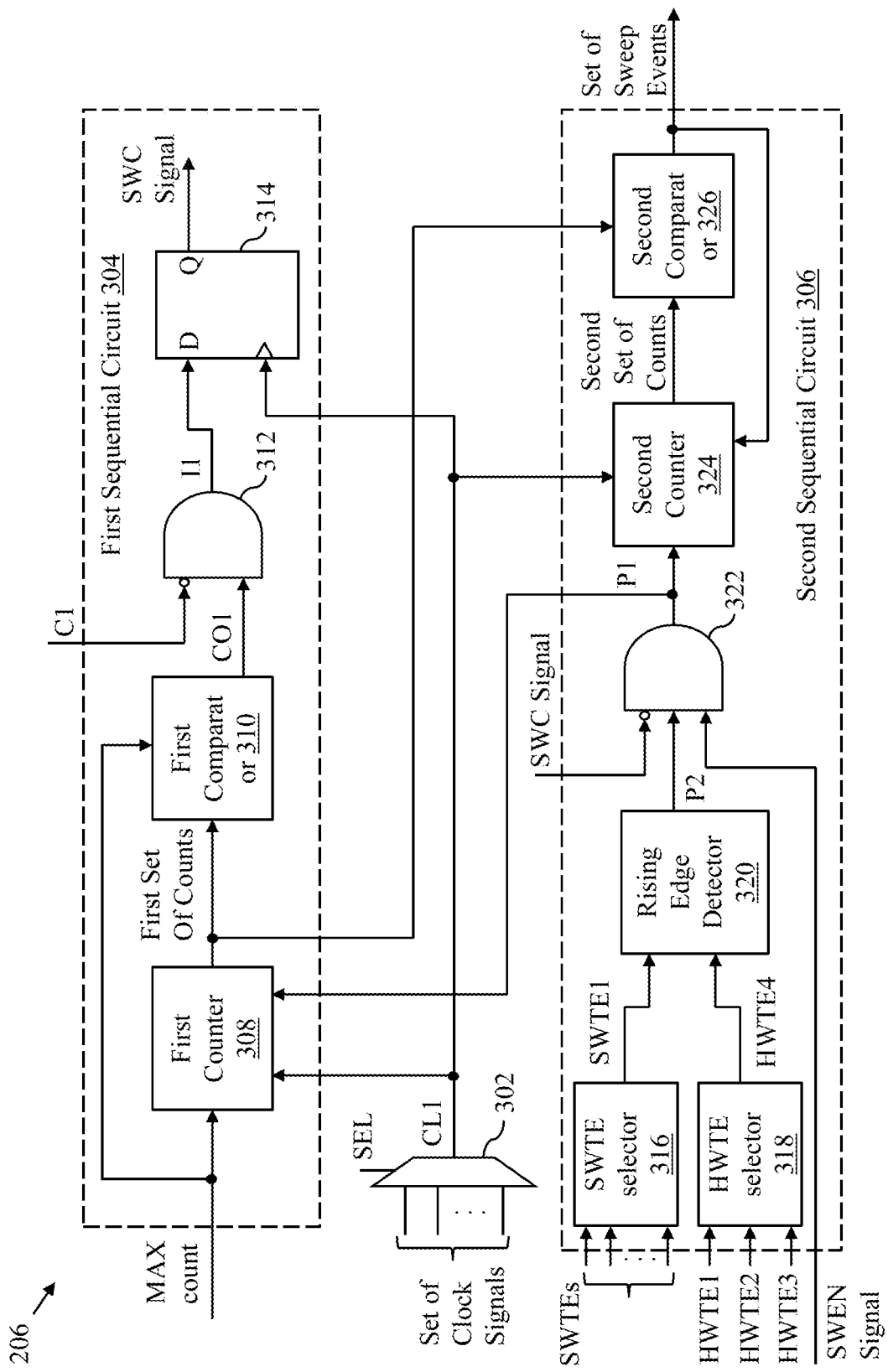
FIG. 3 is a schematic block diagram of a sweep control circuitry of a built-in self-testing (BIST) circuitry of the BISTFC circuitry of FIG. 2 in accordance with an embodiment of the present invention.
Figure 4:
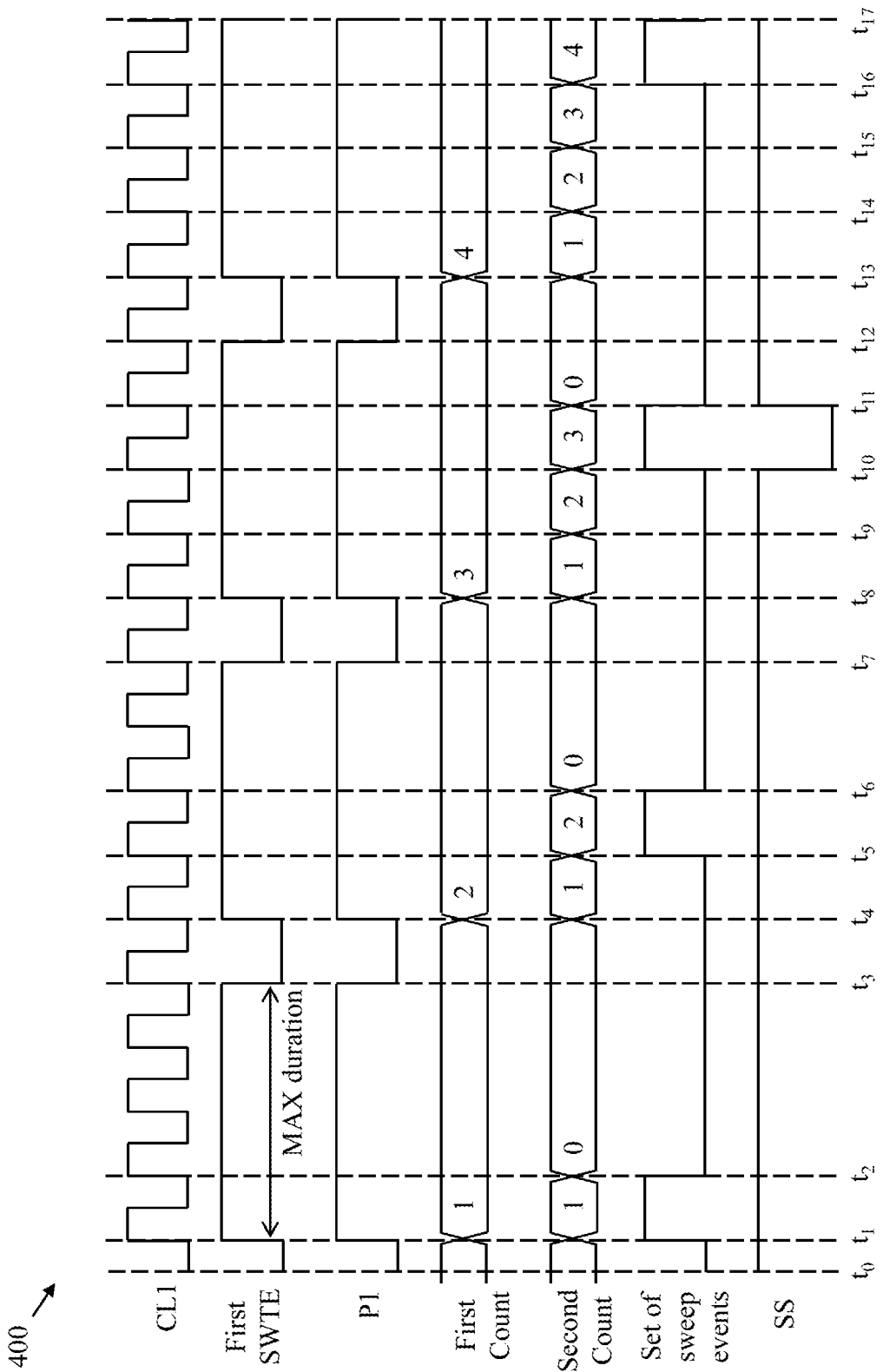
FIG. 4 is a timing diagram that illustrates generation of a set of sweep events by the sweep control circuitry of FIG. 3 in accordance with an embodiment of the present invention.

When the SWEN signal goes low, the BISTFC circuitry 104 generates, based on the generation of the SWTEs and the HWTE1-HWTE3, a set of sweep events in the self-testing operation for detecting the glitch (as explained in FIGS. 3 and 4). The total number of sweep events that are to be generated is determined based on the MAX count. Based on each sweep event, a transition of the first processor 102a from the LP mode to the active mode is initiated during the self-testing operation, for detecting a subset of sweep events during which the glitch occurs. Further, the BISTFC circuitry 104 generates a mask signal MS (i.e., a low mask signal MS) in the non-testing operation to prevent the transition of the first processor 102a when the glitch occurs (i.e., to correct the glitch). The BISTFC circuitry 104 thus detects the glitch during the self-testing operation and corrects the detected glitch during the non-testing operation. The detection and correction of the glitch by the BISTFC circuitry 104 is explained in detail in conjunction with FIGS. 2-5.

The watchdog timer 106 is connected to the first processor 102a for generating a first reset signal to reset the first processor 102a. When enabled, the watchdog timer 106 is configured to up-count from an initial count (such as zero) to a first threshold count. In an event of a successful transition, the first processor 102a generates a second reset signal for resetting the watchdog timer 106 to the initial count before the first threshold count of the watchdog timer 106 is reached. In an event that the transition of the first processor 102a fails, the first processor 102a is unable to reset the watchdog timer 106. Hence, a final count of the watchdog timer 106 exceeds the first threshold count and the first reset signal is generated. When the first reset signal is generated, the watchdog timer 106 further generates the status signal SS. In one embodiment, the status signal SS is low to indicate that the first processor 102a is reset.

The LP protocol controller 108 is connected to the BISTFC circuitry 104 for receiving the set of sweep events and the mask signal MS in the self-testing and non-testing operations, respectively. On receiving the set of sweep events and the mask signal MS (i.e., a high mask signal MS), the LP protocol controller 108 generates a first transition signal $TS_1$ to initiate the transition of the first processor 102a from the LP mode to the active mode during the self-testing and non-testing operations, respectively.

The LP protocol controller 108 further generates the HWTE1. During the non-testing operation in the active mode, the LP protocol controller 108 monitors the first processor 102a to determine whether the first processor 102a is idle. When the LP protocol controller 108 determines that the first processor 102a is idle, the LP protocol controller 108 generates a second transition signal $TS_2$ for transitioning the first processor 102a to the LP mode to conserve power. The LP protocol controller 108 operates on a configurable LP protocol. The LP protocol controller 108 includes a set of registers (not shown) that is based on a finite state machine (FSM) implementation of the configurable LP protocol.

The reset circuitry 110 is configured to reset the SoC 100 (i.e., reset at least one of the first processor 102a, the BISTFC circuitry 104, the watchdog timer 106, and the LP protocol controller 108) when inoperable conditions (such as brown-out) that may damage the SoC 100 are detected by the reset circuitry 110. Further, the reset circuitry 110 generates the HWTE2 for the generation of the set of sweep events. The HWTE2 is similar to the HWTE1.

The interrupt controller 112 receives a set interrupts (not shown) from the first processor 102a or an external source (not shown), for initiating a transition of the first processor 102a from the LP mode to the active mode, during the non-testing operation. Further, the interrupt controller 112 selects and provides an interrupt from the set interrupts to the first processor 102a as well as prioritizes the set of interrupts. An operation of an interrupt controller (such as the interrupt controller 112) is known by those of skill in the art.

The power management controller 114 generates and provides the power supply signal VS to the set of processors 102, the BISTFC circuitry 104, the watchdog timer 106, the LP protocol controller 108, the reset circuitry 110, and the interrupt controller 112. Further, the power management controller 114 receives the first transition signal $TS_1$ and initiates the transition of the first processor 102a from the active mode to the LP mode by reducing a power supplied to the first processor 102a by way of the power supply signal VS. Similarly, the power management controller 114 receives the second transition signal $TS_2$ and initiates the transition of the first processor 102a to the active mode from the LP mode by restoring the power supplied to the first processor 102a by way of the power supply signal VS.

The SoC 100 further includes a clock circuitry (not shown) that generates a set of clock signals (shown in FIG. 3). The clock circuitry further generates the HWTE3 for generating the set of sweep events. The HWTE3 is similar to the HWTE1.

Referring now to FIG. 2, a schematic block diagram of the BISTFC circuitry 104 in accordance with an embodiment of the present invention is shown. The BISTFC circuitry 104 includes a built-in self-testing (BIST) circuitry 202 and an adaptive masking circuitry 204.

The BIST circuitry 202 includes a sweep control circuitry 206 and a diagnostic support circuitry 208. The sweep control circuitry 206 is connected to the first processor 102a for receiving the SWEN signal, the SWTEs, and the MAX count. The sweep control circuitry 206 generates the set of sweep events when the SWEN signal is low. Each sweep event has a start-time and an end-time. The first processor 102a transitions from the LP mode to the active mode at any time instance between a start-time and an end-time of a sweep event. The sweep control circuitry 206 is further connected to the LP protocol controller 108, the reset circuitry 110, and the clock circuitry for receiving the HWTE1-HWTE3, respectively. Further, the sweep control circuitry 206 receives the set of clock signals from the clock circuitry. The set of sweep events is generated based on the MAX count, a first clock signal CL1 (shown in FIG. 3) of the set of clock signals, and one of the HWTE1-HWTE3 and the SWTEs. The working of the sweep control circuitry 206 is explained in detail in FIG. 3, and the generation of the set of sweep events is explained in detail in FIG. 4.

The diagnostic support circuitry 208 is connected to the sweep control circuitry 206 and the watchdog timer 106 for receiving the set of sweep events and the status signal SS, respectively. The diagnostic support circuitry 208 identifies, based on the status signal SS, the subset of sweep events at which the transition of the first processor 102a from the LP mode to the active mode failed. In one example, the set of sweep events includes first through tenth sweep events having first through tenth start-times and end-times, respectively. Further, the first processor 102a fails to transition when the fourth and sixth sweep events are generated. Thus, the subset of sweep events includes the fourth and sixth sweep events.

The diagnostic support circuitry 208 generates sweep failure data based on the subset of sweep events. The sweep failure data includes an identifier, a start-time, and an end-time of each sweep event of the subset sweep events. In the example, the sweep failure data includes identifiers of the fourth and sixth sweep events and the fourth and sixth start-times and end-times, respectively. The sweep failure data further includes contents of the set of registers when each sweep event of the subset of sweep events is generated (i.e., contents of the set of registers between the fourth start-time and the fourth end-time, and between the sixth start-time and the sixth end-time). The generation of the sweep failure data indicates a completion of the self-testing operation.

The diagnostic support circuitry 208 includes a memory (not shown) for storing the sweep failure data. The diagnostic support circuitry 208 further includes a software interface (not shown) for facilitating communication between the diagnostic support circuitry 208 and an external debug circuit (not shown). The external debug circuit reads the sweep failure data through the software interface. With the help of the external debug circuit, a manufacturer of the SoC 100 determines a cause of the failure of the transition of the first processor 102a from the LP mode to the active mode. After the cause of the failure is determined, a next batch of SoCs (not shown) that are similar to the SoC 100 is manufactured such that the cause of the failure is eliminated in the next batch of SoCs.

The adaptive masking circuitry 204 is connected to the diagnostic support circuitry 208 for receiving the sweep failure data that is stored in the memory. The adaptive masking circuitry 204 generates the mask signal MS based on the sweep failure data such that a transition of the first processor 102a from the LP mode to the active mode is prevented in the non-testing operation at potentially erroneous time windows. In one embodiment, a low mask signal MS is generated for a duration of each sweep event of the subset of sweep events and a high mask signal MS is generated for a duration of each of the remaining sweep events (at which the transition of the first processor 102a is successful). The LP protocol controller 108 receives the mask signal MS and generates the first transition signal $TS_1$ when the mask signal MS is high. In the example, the mask signal MS is generated such that a transition of the first processor 102a from the LP mode to the active mode is prevented for a duration of the fourth and sixth sweep events (i.e., between the fourth and sixth start-times and the fourth and sixth end-times). By preventing the transition of the first processor 102a at potentially erroneous time windows (i.e., between the fourth and sixth start-times and the fourth and sixth end-times, respectively), the adaptive masking circuitry 204 prevents a malfunctioning of the SoC 100.

Since the self-testing operation is periodically executed by the first processor 102a, the sweep failure data is periodically updated by the diagnostic support circuitry 208. In the example, during the next self-testing operation, the diagnostic support circuitry 208 determines that the transition of the first processor 102a fails during the fifth sweep event. Thus, the sweep failure data is updated to include an identifier of the fifth sweep event, the fifth start-time, and the fifth end-time. Further, the adaptive masking circuitry 204 generates a low mask signal MS during the fifth start-time and the fifth end-time. Thus, the diagnostic support circuitry 208 and the adaptive masking circuitry 204 enable the BISTFC circuitry 104 to execute a self-correction mechanism for correcting the failure of the transition of the first processor 102a that is detected during the next self-testing operation.

Referring now to FIG. 3, a schematic block diagram of the sweep control circuitry 206 in accordance with an embodiment of the present invention is shown. The sweep control circuitry 206 includes a clock multiplexer (MUX) 302 and first and second sequential circuits 304 and 306.

The clock MUX 302 receives the set of clock signals and a select signal SEL. Based on the select signal SEL, the clock MUX 302 outputs the first clock signal CL1. The select signal SEL is generated by the programmable device. In one embodiment, the set of sweep events is generated with a first sweep granularity that is based on one of a positive clock edge and a negative clock edge of the first clock signal CL1. For example, if a clock period of the first clock signal CL1 is 1 millisecond, the first sweep granularity is equal to the clock period. Thus, a duration of each sweep event is 1 millisecond. In another embodiment, the set of sweep events is generated with a second sweep granularity that is based on both the positive and negative clock edges of the first clock signal CL1. For example, when the clock period is 1 millisecond, the second sweep granularity is equal to one half of the clock period and hence a duration of each sweep event is 0.5 millisecond. Thus, when the set of sweep events is generated with the second sweep granularity, a duration of each sweep event is halved as compared to a duration of each sweep event when the set of sweep events is generated with the first sweep granularity. For the sake of ongoing discussion, it is assumed that the set of sweep events is generated with the first sweep granularity.

The first sequential circuit 304 is connected to the clock MUX 302 and the first processor 102a for receiving the first clock signal CL1 and the MAX count, respectively, and further receives a first control signal C1 and a first pulse signal P1. The first control signal C1 triggers the generation of the set of sweep events. Based on the first clock and first pulse signals CL1 and P1, the first sequential circuit 304 generates a first set of counts. Further, the first sequential circuit 304 generates a sweep complete (SWC) signal to indicate that a final sweep event of the set of sweep events is generated, based on the first set of counts and the first control signal C1. The first sequential circuit 304 includes a first counter 308, a first comparator 310, a first logic gate 312, and a flip-flop 314.

The first counter 308 receives the first clock signal CL1, the MAX count, and the first pulse signal P1, and is incremented based on the first pulse signal P1 to generate the first set of counts. The first counter 308 is an up-counter and has an initial count of zero. For generating the first set of counts, the first counter 308 is incremented for each reception of a positive edge of the first pulse signal P1. The first counter 308 has a second threshold count that is equal to the MAX count. Thus, the first counter 308 stops incrementing when a first final count of the first set of counts is equal to the MAX count. An equality of the first final count and the MAX count is indicative of generation of the final sweep event.

The first comparator 310 is connected to the first counter 308 for receiving each count of the first set of counts. The first comparator 310 further receives the MAX count. On comparing each count of the first set of counts and the MAX count, the first comparator 310 generates a first comparison signal CO1. In one embodiment, the first comparison signal CO1 is high when the first final count is equal to the MAX count. Thus, a high first comparison signal CO1 indicates that the final sweep event is generated.

The first logic gate 312 is connected to the first comparator 310 for receiving the first comparison signal CO1. The first logic gate 312 further receives the first control signal C1. When the SWEN signal goes low, the first control signal C1 is low for triggering the generation of the set of sweep events. The first logic gate 312 generates a first intermediate signal I1 based on the first comparison signal CO1 and the first control signal C1. In one embodiment, the first logic gate 312 is an AND gate. Thus, when the first control signal C1 is low and the first comparison signal CO1 is high, the first intermediate signal I1 is high.

The flip-flop 314 is connected to the clock MUX 302 and the first logic gate 312 for receiving the first clock signal CL1 and the first intermediate signal I1, respectively. The flip-flop 314 generates the SWC signal based on the first intermediate signal I1. In one embodiment, the flip-flop 314 is a D flip-flop. Thus, when the first intermediate signal I1 is high, the SWC signal is high, indicating that the final sweep event is generated. The high SWC signal deactivates the second sequential circuit 306. For generating another set of sweep events, the first control signal C1 is driven high, thereby driving the SWC signal low (and activating the second sequential circuit 306).

The second sequential circuit 306 is connected to the clock MUX 302, the first processor 102a, the LP protocol controller 108, and the reset circuitry 110 for receiving the first clock signal CL1, the SWTEs, the HWTE1, and the HWTE2, respectively. The second sequential circuit 306 is further connected to the first sequential circuit 304 for receiving the first set of counts and the SWC signal. Further, the second sequential circuit 306 receives the HWTE3 and the SWEN signal. The second sequential circuit 306 generates the first pulse signal P1 based on the SWEN and SWC signals, and the SWTEs and the HWTE1-HWTE3. Further, the second sequential circuit 306 generates the set of sweep events based on the first pulse and first clock signals P1 and CL1 and the first set of counts. The second sequential circuit 306 includes an SWTE selector 316, an HWTE selector 318, a rising edge detector 320, a second logic gate 322, a second counter 324, and a second comparator 326.

The SWTE selector 316 is connected to the first processor 102a for receiving the SWTEs. The SWTE selector 316 is configured to select and output a first SWTE (hereinafter referred to as "SWTE1"). The HWTE selector 318 is connected to the LP protocol controller 108, the reset circuitry 110, and the clock circuitry for receiving the HWTE1-HWTE3, respectively. The HWTE selector 318 is configured to select and output a fourth HWTE (i.e., one of the HWTE1-HWTE3). The fourth HWTE is hereinafter referred to as "HWTE4". One of the SWTE or HWTE selector 316 or 318 is activated at a time. The activation of the SWTE or HWTE selector 316 or 318 is controlled by the first processor 102a or the programmable device. In one embodiment, the SWTE and HWTE selectors 316 and 318 are implemented as MUXs.

The rising edge detector 320 is connected to the SWTE and HWTE selectors 316 and 318 for receiving one of the SWTE1 and the HWTE4. When the SWTE selector 316 is activated, the rising edge detector 320 receives the SWTE1, and when the HWTE selector 318 is activated, the rising edge detector 320 receives the HWTE4. The rising edge detector 320 generates a second pulse signal P2 based on a received TE (i.e., one of the SWTE1 and HWTE4). In one example, the SWTE selector 316 is activated. The rising edge detector 320 thus receives the SWTE1 and generates the second pulse signal P2 such that the second pulse signal P2 is driven high when the SWTE1 transitions from low to high. The second pulse signal P2 remains high for a duration less than or equal to the MAX duration.

The second logic gate 322 is connected to the rising edge detector 320 and the first sequential circuit 304 for receiving the second pulse signal P2 and the SWC signal, respectively. The second logic gate 322 further receives the SWEN signal. Based on the second pulse signal P2 and the SWC and SWEN signals, the second logic gate 322 generates the first pulse signal P1. In one embodiment, the second logic gate 322 is an AND gate. Thus, when the SWC signal is low (i.e., the final sweep event is not generated), the second pulse signal P2 transitions from low to high, and the SWEN signal is high, the first pulse signal P transitions from low to high. When the first pulse signal P1 transitions from low to high, the first counter 308 is incremented.

The second counter 324 is connected to the second logic gate 322 and the clock MUX 302 for receiving the first pulse and first clock signals P1 and CL1, respectively. The second counter 324 is an up-counter having an initial count equal to zero. Further, the second counter 324 is incremented based on the first clock signal CL1 to generate a second set of counts. In one embodiment, when the first pulse signal P1 is high, the second counter 324 is incremented at each reception of a positive edge of the first clock signal CL1. The second counter 324 further receives the set of sweep events. The second counter 324 is reset (i.e., a second final count of the second counter 324 is equal to the initial count) on receiving a sweep event. After the reset, the second counter 324 initiates generation of the second set of counts when the first pulse signal P1 goes high again.

The second comparator 326 is connected to the first and second counters 308 and 324 for receiving the first and second sets of counts, respectively. The second comparator 326 compares each count of the first and second sets of counts and generates the set of sweep events based on a comparison of each count of the first and second sets of counts. When a first count of the first set of counts is equal to a second count of the second set of counts, a first sweep event is generated. The generation of the first and second sets of counts is illustrated in FIG. 4.

Referring now to FIG. 4, a timing diagram 400 that illustrates the generation of the set of sweep events by the sweep control circuitry 206 in accordance with an embodiment of the present invention is shown. The generation of the set of sweep events is further illustrated by way of the SWTE1, the first pulse signal P1, the first and second sets of counts of the first and second counters 308 and 324, respectively, and the status signal SS. For the sake of simplicity of the ongoing discussion, it is assumed that the set of sweep events includes first through fourth sweep events and a glitch occurs when the third sweep event is generated (i.e., the subset of sweep events includes the third sweep event).

It is further assumed that a duration of the first pulse signal P1 is equal to the MAX duration (i.e., equal to a duration of the SWTE1). During time period $t_0$-$t_1$, the first and second counters 308 and 324 have first and second counts equal to zero (not shown), respectively, the first pulse signal P is low, and the status signal SS is high to indicate that the first processor 102a is not reset. At time instance $t_1$ (i.e., at a first positive clock edge), the first pulse signal P1 transitions from low to high. Thus, the first counter 308 is incremented to one (i.e., the first count is equal to '1'). Further, the second counter 324 is incremented to one (i.e., the second count is equal to '1'). As the first and second counts are equal, the first sweep event is generated. The second counter 324 receives the first sweep event.

During time period $t_1$-$t_2$, the first and second counts are equal to one, and the first pulse signal P1 remains high. At time instance $t_2$ (i.e., at a second positive clock edge), the second counter 324 is reset to zero (i.e., the second count is equal to '0'). During time period $t_2$-$t_3$, the first count (which is equal to '1') is unchanged, the second count is equal to zero, and the first pulse signal P1 remains high. Further, a high status signal SS indicates that the first processor 102a is not reset. At time instance $t_3$ (i.e., at a third positive clock edge), the first pulse signal P1 transitions from high to low. During time period $t_3$-$t_4$, the first pulse signal P1 is low, and the first and second counts remain unchanged (i.e., '1' and '0', respectively).

At time instance $t_4$ (i.e., at a positive clock edge), the first pulse signal P goes high. Thus, the first counter 308 is incremented to two (i.e., the first count is equal to '2'). Further, the second counter 324 is incremented to one (i.e., the second count is equal to '1'). During time period $t_4$-$t_5$, the first count is equal to two, the second count is equal to one, and the first pulse signal P1 remains high. At time instance $t_5$ (i.e., at a fifth positive clock edge), the second counter 324 is incremented to two (i.e., the second count is equal to '2'). As the first and second counts are equal, the second sweep event is generated. The second counter 324 receives the second sweep event. During time period $t_5$-$t_6$, the first and second counts are equal to two, and the first pulse signal P1 remains high. Further, as the status signal SS is high, the first processor 102a is not reset.

At time instance $t_6$ (i.e., at a sixth positive clock edge), the second counter 324 is reset to zero (i.e., the second count is equal to '0'), the first count (which is equal to '2') is unchanged, and the first pulse signal P1 remains high. During time period $t_6$-$t_7$, the first count is unchanged, the second count is equal to zero, and the first pulse signal P remains high. At time instance $t_7$ (i.e., at a seventh positive clock edge), the first pulse signal P1 goes low. During time period $t_7$-$t_8$, the first and second counts remain unchanged (i.e., '2' and '0', respectively), and the first pulse signal P remains low.

At time instance $t_8$ (i.e., at an eighth positive clock edge), the first pulse signal P1 goes high. Thus, the first counter 308 is incremented to three (i.e., the first count is equal to '3'). Further, the second counter 324 is incremented to one (i.e., the second count is equal to '1'). During time period $t_8$-$t_9$, the first count is equal to three, the second count is equal to one, and the first pulse signal P1 remains high. At time instance $t_9$ (i.e., at a ninth positive clock edge), the second counter 324 is incremented to two (i.e., the second count is equal to '2'). During time period $t_9$-$t_{10}$, the first count (which is equal to '3') is unchanged, the second count is equal to two, and the first pulse signal P remains high. At time instance to (i.e., at a tenth positive clock edge), the second counter 324 is incremented to three (i.e., the second count is equal to '3'). As the first and second counts are equal, the third sweep event is generated. The second counter 324 receives the third sweep event. Further, the status signal SS transitions from high to low, indicating that the first processor 102a is reset.

During time period $t_{10}$-$t_{11}$, the first and second counts are equal to three, the first pulse signal P1 remains high, and the status signal SS remains low. At time instance $t_{10}$ (i.e., at an eleventh positive clock edge), the second counter 324 is reset to zero (i.e., the second count is equal to '0'). Further, the status signal SS transitions from low to high. During time period $t_{11}$-$t_{12}$, the first count is unchanged, the second count is equal to zero, and the first pulse signal P1 remains high. At time instance $t_{12}$ (i.e., at a twelfth positive clock edge), the first pulse signal P1 goes low. During time period $t_{12}$-$t_{13}$, the first and second counts are unchanged (i.e., '3' and '0', respectively), and the first pulse signal P1 remains low.

At time instance $t_{13}$ (i.e., at a thirteenth positive clock edge), the first pulse signal P1 goes high. Thus, the first counter 308 is incremented to four (i.e., the first count is equal to '4'). Further, the second counter 324 is incremented to one (i.e., the second count is equal to '1'). During time period $t_{13}$-$t_{14}$, the first count is equal to four, the second count is equal to one, and the first pulse signal P1 remains high. At time instance $t_{14}$ (i.e., at a fourteenth positive clock edge), the second counter 324 is incremented to two (i.e., the second count is equal to '2'). During time period $t_{14}$-$t_{15}$, the first count (which is equal to '4') is unchanged, the second count is equal to two, and the first pulse signal P1 remains high.

At time instance $t_{15}$ (i.e., at a fifteenth positive clock edge), the second counter 324 is incremented to three (i.e., the second count is equal to '3'). During time period $t_{15}$-$t_{16}$, the first count is unchanged, the second count is equal to three, and the first pulse signal P1 remains high. At time instance $t_{16}$ (i.e., at a sixteenth positive clock edge), the second counter 324 is incremented to four (i.e., the second count is equal to '4'). As the first and second counts are equal, the fourth sweep event is generated. At time instance $t_{17}$, the first pulse signal P1 transitions from high to low.

As the SWTE1 is high for the MAX duration, time periods $t_1$-$t_3$, $t_4$-$t_7$, $t_8$-$t_{12}$, and $t_{13}$-$t_{17}$ are equal. Further, time period $t_1$-$t_2$ corresponds to the first sweep event, time period $t_5$-$t_6$ corresponds to the second sweep event, time period $t_{10}$-$t_{11}$ corresponds to the third sweep event, and time period $t_{16}$-$t_{17}$ corresponds to the fourth sweep event. Thus, the first through fourth sweep events are generated such that entire MAX duration is swept (i.e., addition of time periods $t_1$-$t_2$, $t_5$-$t_6$, $t_{10}$-$t_{11}$, and $t_{16}$-$t_{17}$ is equal to the MAX duration). Thus, the sweep control circuitry 206 ensures that the transition of the first processor 102a from the LP mode to the active mode may be initiated at any instance during the MAX duration.

Figure 5:
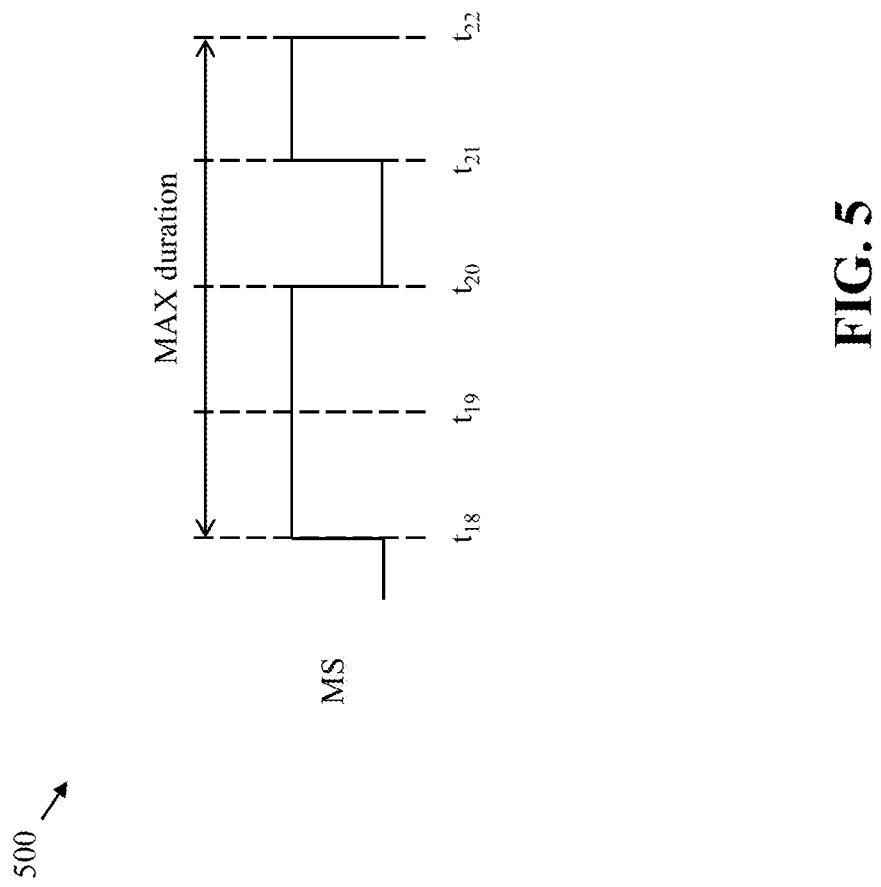
FIG. 5 is a timing diagram that illustrates generation of a mask signal by an adaptive masking circuitry of the BISTFC circuitry of FIG. 2 in accordance with an embodiment of the present invention.

Referring now to FIG. 5, a timing diagram 500 that illustrates the generation of the mask signal MS by the adaptive masking circuitry 204 in accordance with an embodiment of the present invention is shown. The mask signal MS is generated during time period $t_{18}$-$t_{22}$ which is equal to the MAX duration (i.e., addition of time periods $t_1$-$t_2$, $t_5$-$t_6$, $t_{10}$-$t_{11}$, and $t_{16}$-$t_{17}$). For the sake of ongoing discussion, it is assumed that time periods $t_{18}$-$t_{19}$, $t_{19}$-$t_{20}$, $t_{20}$-$t_{21}$, and $t_{21}$-$t_{22}$ correspond to time periods $t_1$-$t_2$, $t_5$-$t_6$, $t_{10}$-$t_{11}$, and $t_{16}$-$t_{17}$, respectively.

At time instance tis (which corresponds to time instance $t_1$), the mask signal MS goes high. As time period $t_{18}$-$t_{19}$ corresponds to time period $t_1$-$t_2$ during which the first sweep event is generated, the mask signal MS remains high during time period $t_{18}$-$t_{19}$. Thus, the LP protocol controller 108 may generate the first transition signal $TS_1$ at any instance during time period $t_{18}$-$t_{19}$.

As time period $t_{19}$-$t_{20}$ corresponds to time period $t_5$-$t_6$ during which the second sweep event is generated, the mask signal MS remains high during time period $t_{19}$-$t_{20}$. Thus, the LP protocol controller 108 may generate the first transition signal $TS_1$ at any instance during time period $t_{19}$-$t_{20}$.

At time instance $t_{20}$ (which corresponds to time instance $t_{10}$), the mask signal MS goes low. As time period $t_{20}$-$t_{21}$ corresponds to time period $t_{10}$-$t_{11}$ during which the third sweep event is generated, the mask signal MS remains low during time period $t_{20}$-$t_{21}$. Thus, the LP protocol controller 108 does not generate the first transition signal $TS_1$ during time period $t_{20}$-$t_{21}$, thereby preventing the failure of the transition of the first processor 102a from the LP mode to the active mode.

At time instance $t_{21}$ (which corresponds to time instance $t_{16}$), the mask signal MS goes high. As time period $t_{21}$-$t_{22}$ corresponds to time period $t_{16}$-$t_{17}$ during which the fourth sweep event is generated, the mask signal MS remains high during time period $t_{21}$-$t_{22}$. Thus, the LP protocol controller 108 may generate the first transition signal $TS_1$ at any instance during time period $t_{21}$-$t_{22}$.

Figure 6A:
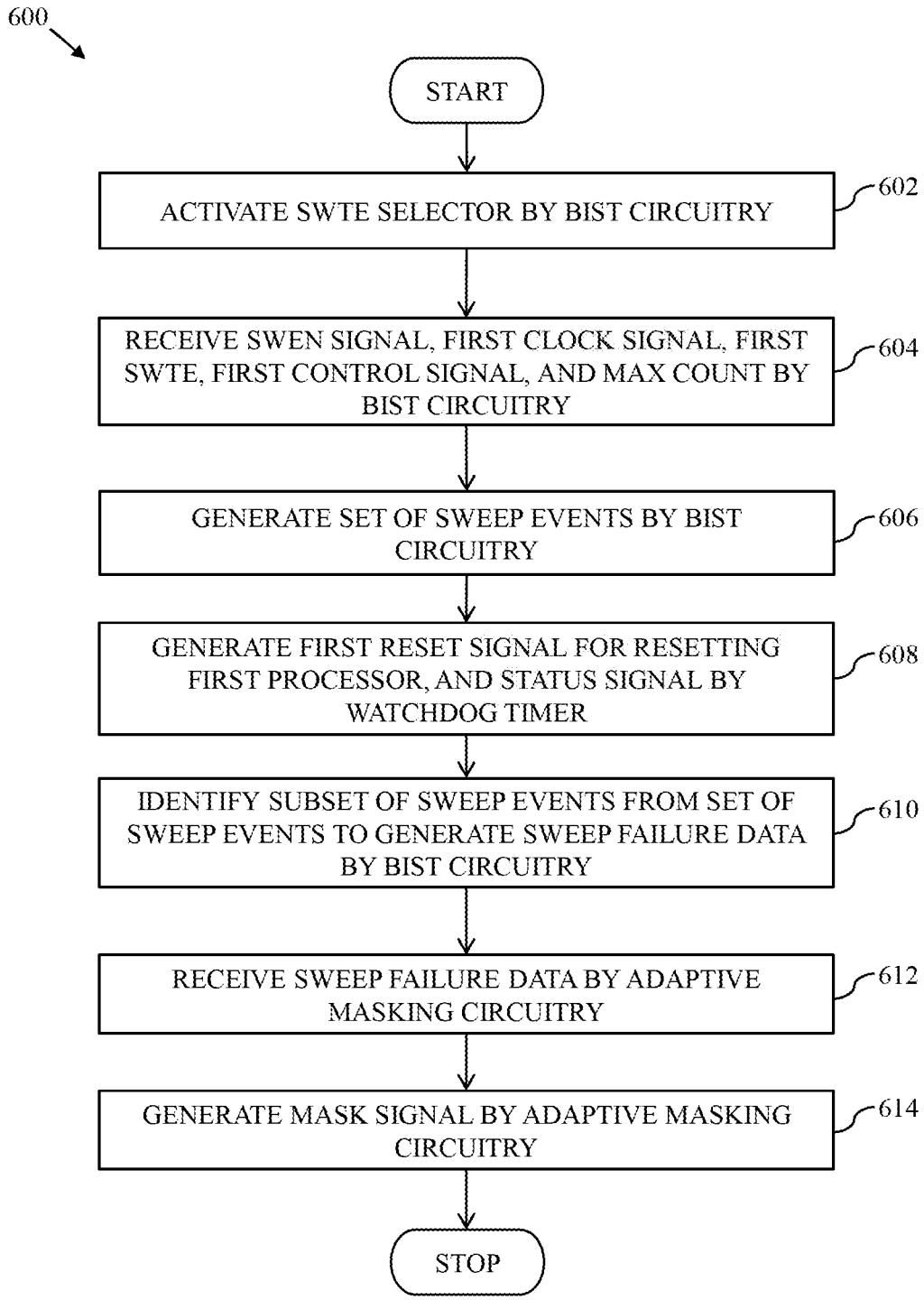
FIGS. 6A and 6B, collectively, represent a flow chart that illustrates a method for testing the SoC by the BISTFC circuitry of FIG. 2 in accordance with an embodiment of the present invention.
Figure 6B:
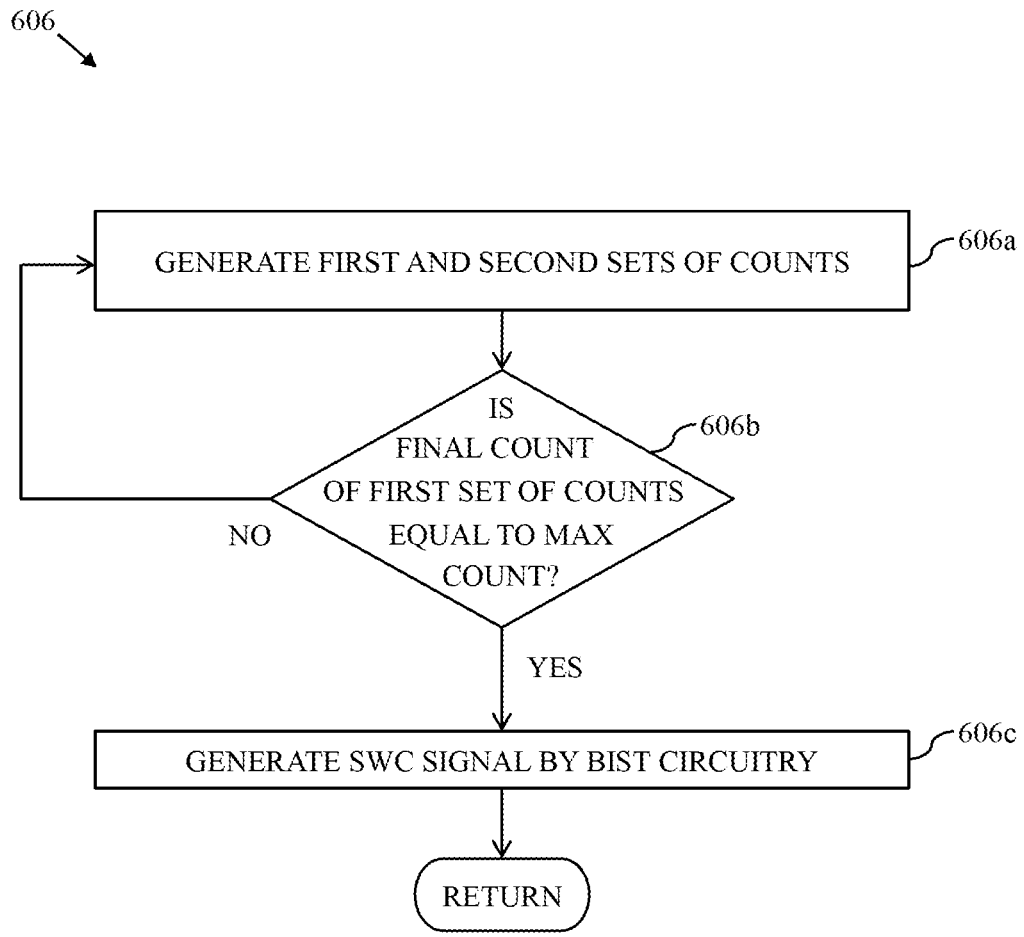

Referring now to FIGS. 6A and 6B, a flow chart 600 illustrating a method for testing the SoC 100 (i.e., for detecting and correcting a glitch) by the BISTFC circuitry 104 in accordance with an embodiment of the present invention is shown. For the sake of ongoing discussion, it is assumed that the BIST circuitry 202 receives the SWTE1 in the self-testing operation.

At step 602, the BIST circuitry 202 activates the SWTE selector 316. At step 604, the BIST circuitry 202 receives the SWEN signal (i.e., the low SWEN signal), the first clock signal CL1, the SWTE1, the first control signal C1, and the MAX count. At step 606, the BIST circuitry 202 generates the set of sweep events based on the SWEN signal.

Referring now to FIG. 6B, at step 606a, the BIST circuitry 202 generates the first and second sets of counts. Each count of the first set of counts is generated based on the first pulse signal P1, the first clock signal CL1, and the MAX count. Further, each count of the second set of counts is generated based on the first clock signal CL. At step 606b, the BIST circuitry 202 determines whether the final count of the first set of counts is equal to the MAX count (i.e., determines whether the final sweep event is generated). If at step 606b, it is determined that the final count is unequal to the MAX count, the BIST circuitry 202 executes step 606a (i.e., generates a next count of each of the first and second sets of counts and step 606b is executed). If at step 606b, it is determined that the final count is equal to the MAX count, the BIST circuitry 202 executes step 606c. At step 606c, the BIST circuitry 202 generates the SWC signal (i.e., the low SWC signal) to indicate that the final sweep event is generated.

Referring back to FIG. 6A, at step 608, the watchdog timer 106 generates the first reset signal for resetting the first processor 102a, and the status signal SS to indicate whether the first processor 102a is reset. At step 610, the BIST circuitry 202 identifies, based on the status signal SS, the subset of sweep events at which the glitch occurs to generate the sweep failure data. At step 612, the adaptive masking circuitry 204 receives the sweep failure data during the non-testing operation. At step 614, the adaptive masking circuitry 204 generates the mask signal MS (i.e., a low mask signal MS) based on the sweep failure data for preventing the transition of the first processor 102a from the LP mode to the active mode during the non-testing operation at potentially erroneous time windows. Thus, a failure of the transition of the first processor 102a from the LP mode to the active mode during the non-testing operation is prevented.

For the sake of simplicity, it is described that step 610 (i.e., the step of identification of the subset of sweep events) is executed after step 608 (i.e., the step of generation of the set of sweep events) is executed. However, it will be understood by a person skilled in the art that steps 608 and 610 may be executed simultaneously (i.e., as soon as a sweep event is generated, it is identified whether the transition of the first processor 102a based on the generated sweep event failed).

For detecting the glitch that is caused by the triggering of the asynchronous transition of the first processor 102a and undetected by current mechanisms of pre and post silicon verification), the BISTFC circuitry 104 detects potentially erroneous time windows (such as time period $t_{10}$-$t_{11}$) during the self-testing operation. Further, during the non-testing operation, the BISTFC circuitry 104 ensures that a transition of the first processor 102a is prevented during the erroneous time windows (such as time period $t_{20}$-$t_{21}$). Thus, by preventing the transition during the erroneous time windows (i.e., by correcting the glitch), malfunctioning of the SoC 100 is prevented. Further, validation time of the SoC 100 (i.e., time required for testing and verification of the SoC 100 before commercialization) is reduced, since the glitch is easily detectable by the BISTFC circuitry 104. Furthermore, as the sweep control circuitry 206 includes counters (such as the first and second counters 308 and 324), logic gates (such as the first and second logic gates 312 and 322), and other combinational logic circuits (such as the first and second comparators 310 and 326), the BISTFC circuitry 104 consumes low area on the SoC 100.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system-on-chip (SoC), comprising:
a first processor that generates a sweep enable (SWEN) signal to initiate a self-testing operation of the SoC;
a built-in self-testing (BIST) circuitry, comprising:
a sweep control circuitry that is connected to the first processor for receiving the SWEN signal and generates a set of sweep events, wherein a transition of the first processor from a low power (LP) mode to an active mode during the self-testing operation is initiated based on the generation of each sweep event of the set of sweep events; and
a diagnostic support circuitry that is connected to the sweep control circuitry for receiving the set of sweep events, further receives a status signal, identifies, based on the status signal, a subset of sweep events from the set of sweep events at which the transition of the first processor from the LP mode to the active mode failed, and generates sweep failure data, wherein the status signal indicates whether the first processor is reset.

2. The SoC of claim 1, further comprising:
a watchdog timer that generates the status signal, and further generates a reset signal for resetting the first processor, wherein the reset signal is generated when a final count of the watchdog timer exceeds a first threshold count of the watchdog timer, and wherein when the reset signal is generated, the status signal indicates that the first processor is reset.

3. The SoC of claim 1, wherein the first processor further generates a plurality of software trigger events (SWTEs), and wherein a time duration of each SWTE of the plurality of SWTEs is equal to a maximum (MAX) duration of the first processor to remain in the LP mode during the self-testing operation, before transitioning to the active mode.

4. The SoC of claim 3, further comprising:
an LP protocol controller that is connected to the BIST circuitry for receiving the set of sweep events and generates a transition signal, wherein when the transition signal is generated, the transition of the first processor from the LP mode to the active mode is initiated; and
a reset circuitry for resetting the SoC, wherein the LP protocol controller and the reset circuitry generate first and second hardware trigger events (HWTEs), respectively, and wherein a time duration of each of the first and second HWTEs is equal to the MAX duration.

5. The SoC of claim 4, wherein the sweep control circuitry comprises:
a clock multiplexer (MUX) that receives a plurality of clock signals and a select signal, and outputs a first clock signal of the plurality of clock signals based on the select signal;
a first sequential circuit that is connected to the clock MUX and the first processor for receiving the first clock signal and a MAX count that indicates a total number of sweep events of the set of sweep events, respectively, further receives a first pulse signal and a first control signal, and generates (i) a first set of counts based on the first clock and first pulse signals and the MAX count, and (ii) a sweep complete (SWC) signal based on the first control signal and the first set of counts, wherein the SWC signal indicates whether a final sweep event of the set of sweep events is generated; and
a second sequential circuit that (i) is connected to the clock MUX for receiving the first clock signal, the first sequential circuit for receiving the first set of counts and the SWC signal, the LP protocol controller and the reset circuitry for receiving the first and second HWTEs, respectively, and the first processor for receiving the plurality of SWTEs, (ii) further receives the SWEN signal, and (iii) generates the first pulse signal based on the SWC signal, the SWEN signal, the plurality of SWTEs, and the first and second HWTEs, and the set of sweep events based on the first clock and first pulse signals and the first set of counts.

6. The SoC of claim 5, wherein the first sequential circuit comprises:
a first counter that is connected to the second sequential circuit for receiving the first pulse signal, further receives the first clock signal and the MAX count, and generates the first set of counts, wherein the first counter is incremented based on the first pulse signal to generate the first set of counts, and wherein the MAX count is a second threshold count of the first counter;
a first comparator that is connected to the first counter for receiving each count of the first set of counts, further receives the MAX count, and generates a first comparison signal on comparing each count of the first set of counts and the MAX count;
a first logic gate that is connected to the first comparator for receiving the first comparison signal, further receives the first control signal, and generates a first intermediate signal; and
a flip-flop that is connected to the first logic gate for receiving the first intermediate signal and generates the SWC signal.

7. The SoC of claim 5, wherein the second sequential circuit comprises:
an SWTE selector that is connected to the first processor for receiving the plurality of SWTEs and outputting a first SWTE of the plurality of SWTEs;
an HWTE selector that is connected to the LP protocol controller and the reset circuitry for receiving the first and second HWTEs, respectively, and outputting a third HWTE, wherein the third HWTE is one of the first and second HWTEs;
a rising edge detector that is connected to the SWTE and HWTE selectors for receiving one of the first SWTE and the third HWTE, and generates a second pulse signal based on one of the first SWTE and the third HWTE;
a second logic gate that is connected to the rising edge detector and the first sequential circuit for receiving the second pulse and SWC signals, respectively, further receives the SWEN signal, and generates the first pulse signal;
a second counter that is connected to the second logic gate for receiving the first pulse signal, further receives the first clock signal and the set of sweep events, and generates a second set of counts, wherein the second counter is incremented based on the first clock signal to generate the second set of counts, and wherein the second counter is reset at each sweep event of the set of sweep events; and
a second comparator that is connected to the second counter for receiving the second set of counts, further receives the first set of counts, and generates the set of sweep events based on a comparison of each count of the first and second sets of counts.

8. The SoC of claim 5, wherein each sweep event of the set of sweep events is generated with one of a first sweep granularity and a second sweep granularity, wherein the first sweep granularity is based on one of a positive clock edge and a negative clock edge of the first clock signal, and the second sweep granularity is based on both the positive and negative clock edges of the first clock signal, and wherein when the set of sweep events is generated with the second sweep granularity, a duration of each sweep event is halved as compared to a duration of each sweep event when the set of sweep events is generated with the first sweep granularity.

9. A system-on-chip (SoC), comprising:
a first processor that generates a sweep enable (SWEN) signal to initiate a self-testing operation of the SoC;
a built-in self-testing and failure correction (BISTFC) circuitry, comprising:
a built-in self-testing (BIST) circuitry, comprising:
a sweep control circuitry that is connected to the first processor for receiving the SWEN signal and generates a set of sweep events, wherein a transition of the first processor from a low power (LP) mode to an active mode during the self-testing operation is initiated based on the generation of each sweep event of the set of sweep events; and
a diagnostic support circuitry that is connected to the sweep control circuitry for receiving the set of sweep events, further receives a status signal, identifies, based on the status signal, a subset of sweep events from the set of sweep events at which the transition of the first processor from the LP mode to the active mode failed, and generates sweep failure data, wherein the status signal indicates whether the first processor is reset; and
an adaptive masking circuitry that is connected to the diagnostic support circuitry for receiving the sweep failure data and generating a mask signal based on the sweep failure data, wherein the mask signal prevents a transition of the first processor from the LP mode to the active mode, during a non-testing operation of the SoC.

10. The SoC of claim 9, further comprising:
a watchdog timer that generates the status signal, and further generates a reset signal for resetting the first processor, wherein the reset signal is generated when a final count of the watchdog timer exceeds a first threshold count of the watchdog timer, and wherein when the reset signal is generated, the status signal indicates that the first processor is reset.

11. The SoC of claim 9, wherein the first processor further generates a plurality of software trigger events (SWTEs), and wherein a time duration of each SWTE of the plurality of SWTEs is equal to a maximum (MAX) duration of the first processor to remain in the LP mode during the self-testing operation, before transitioning to the active mode.

12. The SoC of claim 11, further comprising:
an LP protocol controller that is connected to the BIST circuitry and the adaptive masking circuitry for receiving the set of sweep events and the mask signal, respectively, and generates a transition signal based on (i) the set of sweep events during the self-testing operation and (ii) the mask signal during the non-testing operation, wherein when the transition signal is generated, the transition of the first processor from the LP mode to the active mode is initiated; and
a reset circuitry for resetting the SoC, wherein the LP protocol controller and the reset circuitry generate first and second hardware trigger events (HWTEs), respectively, and wherein a time duration of each of the first and second HWTEs is equal to the MAX duration.

13. The SoC of claim 12, wherein the sweep control circuitry comprises:
a clock multiplexer (MUX) that receives a plurality of clock signals and a select signal, and outputs a first clock signal of the plurality of clock signals based on the select signal;
a first sequential circuit that is connected to the clock MUX and the first processor for receiving the first clock signal and a MAX count that indicates a total number of sweep events of the set of sweep events, respectively, further receives a first pulse signal and a first control signal, and generates (i) a first set of counts based on the first clock and first pulse signals and the MAX count, and (ii) a sweep complete (SWC) signal based on the first control signal and the first set of counts, wherein the SWC signal indicates whether a final sweep event of the set of sweep events is generated; and a second sequential circuit that (i) is connected to the clock MUX for receiving the first clock signal, the first sequential circuit for receiving the first set of counts and the SWC signal, the LP protocol controller and the reset circuitry for receiving the first and second HWTEs, respectively, and the first processor for receiving the plurality of SWTEs, (ii) further receives the SWEN signal, and (iii) generates the first pulse signal based on the SWC signal, the SWEN signal, the plurality of SWTEs, and the first and second HWTEs, and the set of sweep events based on the first clock and first pulse signals and the first set of counts.

14. The SoC of claim 13, wherein the first sequential circuit comprises:
a first counter that is connected to the second sequential circuit for receiving the first pulse signal, further receives the first clock signal and the MAX count, and generates the first set of counts, wherein the first counter is incremented based on the first pulse signal to generate the first set of counts, and wherein the MAX count is a second threshold count of the first counter;
a first comparator that is connected to the first counter for receiving each count of the first set of counts, further receives the MAX count, and generates a first comparison signal on comparing each count of the first set of counts and the MAX count;
a first logic gate that is connected to the first comparator for receiving the first comparison signal, further receives the first control signal, and generates a first intermediate signal; and
a flip-flop that is connected to the first logic gate for receiving the first intermediate signal and generates the SWC signal.

15. The SoC of claim 13, wherein the second sequential circuit comprises:
an SWTE selector that is connected to the first processor for receiving the plurality of SWTEs and outputting a first SWTE of the plurality of SWTEs;
an HWTE selector that is connected to the LP protocol controller and the reset circuitry for receiving the first and second HWTEs, respectively, and outputting a third HWTE, wherein the third HWTE is one of the first and second HWTEs;
a rising edge detector that is connected to the SWTE and HWTE selectors for receiving one of the first SWTE and the third HWTE, and generates a second pulse signal based on one of the first SWTE and the third HWTE;
a second logic gate that is connected to the rising edge detector and the first sequential circuit for receiving the second pulse and SWC signals, respectively, further receives the SWEN signal, and generates the first pulse signal;
a second counter that is connected to the second logic gate for receiving the first pulse signal, further receives the first clock signal and the set of sweep events, and generates a second set of counts, wherein the second counter is incremented based on the first clock signal to generate the second set of counts, and wherein the second counter is reset at each sweep event of the set of sweep events; and
a second comparator that is connected to the second counter for receiving the second set of counts, further receives the first set of counts, and generates the set of sweep events based on a comparison of each count of the first and second sets of counts.

16. The SoC of claim 13, wherein each sweep event of the set of sweep events is generated with one of a first sweep granularity and a second sweep granularity, wherein the first sweep granularity is based on one of a positive clock edge and a negative clock edge of the first clock signal, and the second sweep granularity is based on both the positive and negative clock edges of the first clock signal, and wherein when the set of sweep events is generated with the second sweep granularity, a duration of each sweep event is halved as compared to a duration of each sweep event when the set of sweep events is generated with the first sweep granularity.

17. A method for testing a system-on-chip (SoC), the method comprising:
generating, based on a sweep enable (SWEN) signal that indicates an initiation of a self-testing operation of the SoC, by a built-in self-testing (BIST) circuitry of the SoC, a set of sweep events, wherein a transition of a first processor of the SoC from a low power (LP) mode to an active mode during the self-testing operation is initiated based on the generation of each sweep event of the set of sweep events; and
identifying, by the BIST circuitry, based on a status signal, a subset of sweep events from the set of sweep events at which the transition of the first processor from the LP mode to the active mode failed, to generate sweep failure data, wherein the status signal indicates whether the first processor is reset, and wherein the generation of the sweep failure data is indicative of a completion of the self-testing operation.

18. The method of claim 17, further comprising:
receiving, by an adaptive masking circuitry of the SoC, the sweep failure data; and
generating, by the adaptive masking circuitry, during a non-testing operation of the SoC, a mask signal for preventing a transition of the first processor from the LP mode to the active mode at each sweep event of the subset of sweep events.

19. The method of claim 17, further comprising:
generating, by a watchdog timer of the SoC, a reset signal for resetting the first processor, wherein the reset signal is generated when a final count of the watchdog timer exceeds a first threshold count of the watchdog timer, and wherein when the reset signal is generated, the status signal indicates that the first processor is reset.

20. The method of claim 17, further comprising:
receiving a first clock signal, a first control signal, and a maximum (MAX) count, by the BIST circuitry, wherein the MAX count indicates a total number of sweep events of the set of sweep events, and wherein the first control signal triggers the generation of the set of sweep events; and
generating, by the BIST circuitry, (i) a first set of counts based on the first clock signal and the MAX count, and (ii) a sweep complete (SWC) signal based on the first control signal and the first set of counts, wherein the SWC signal indicates whether a final sweep event of the set of sweep events is generated, and wherein the set of sweep events is further generated based on the first clock and SWC signals and the first set of counts.

* * * * *